United States Patent [19]

Sway-Tin

[11] Patent Number: 4,899,256
[45] Date of Patent: Feb. 6, 1990

[54] POWER MODULE

[75] Inventor: Min Sway-Tin, Troy, Mich.

[73] Assignee: Chrysler Motors Corporation, Highland Park, Mich.

[21] Appl. No.: 201,246

[22] Filed: Jun. 1, 1988

[51] Int. Cl.$^4$ .............................................. H05K 7/20
[52] U.S. Cl. ................................. 361/386; 361/394; 361/395; 361/399; 361/400
[58] Field of Search .................... 361/386–389, 361/392–395, 399, 400, 405; 357/81

[56] References Cited

U.S. PATENT DOCUMENTS

| | | |
|---|---|---|
| 3,359,461 | 12/1967 | Schuler et al. .................... 361/392 |
| 4,033,663 | 7/1977 | McCardell . |
| 4,085,988 | 4/1978 | Gamble . |
| 4,109,298 | 8/1978 | Hannai et al. . |
| 4,184,070 | 1/1980 | McBride, Jr. . |
| 4,225,213 | 9/1980 | McBride, Jr. et al. . |
| 4,377,852 | 3/1983 | Thompson . |
| 4,437,141 | 3/1984 | Prokop . |
| 4,466,684 | 8/1984 | Grant et al. . |
| 4,626,962 | 12/1986 | Ahn et al. ......................... 361/395 |
| 4,645,278 | 2/1987 | Yevak, Jr. et al. . |
| 4,685,031 | 8/1987 | Fife et al. . |
| 4,703,397 | 10/1987 | Minoura et al. .................... 361/399 |
| 4,712,160 | 12/1987 | Sato et al. .......................... 361/395 |
| 4,763,225 | 8/1988 | Frenkel et al. ..................... 361/389 |

Primary Examiner—Gregory D. Thompson
Attorney, Agent, or Firm—Mark P. Calcaterra

[57] ABSTRACT

A power module positioned a desired distance away from a circuit board is described. The module includes a housing supported above the circuit board. The housing includes a cavity having a mechanism for electrically coupling the housing with a circuit board and a system. Circuitry is disposed within the housing cavity to perform electrical functions and controls for the system.

9 Claims, 3 Drawing Sheets

RELEVANT ART

RELEVANT ART

POWER MODULE

BACKGROUND OF THE INVENTION

The present invention relates to power modules and, more particularly, to a power module adapted to be electrically coupled with a circuit board and positioned a desired distance away from the circuit board.

Several different types of power modules or terminals exist in the field which plug into circuit boards. Generally, these modules plug directly into the circuit board and abut or rest upon the circuit board. These types of modules are generally preformed and do not enable interchanging of the circuitry within the module. Thus, another different module must be manufactured for each change of the circuitry in the module.

Thus, there is a desire in the field to have a common module which enables interchanging of different circuitry into the module and is adapted to plug into a circuit board. There is a desire to utilize generic circuit boards so that the same circuit boards can be used in several different applications. By changing the power modules and coupling them with the generic circuit boards, a desired circuitry would be produced. It is desired to have a power module which is spaced a predetermined distance away from the circuit board so that the module does not interfere with circuitry already present on the circuit board. Also, the module should enable heat to be dissipated from the circuitry within the module.

FIGS. 7 and 8 illustrate a relevant art ignition system module. The module is designed for mounting onto the side of an engine housing. The engine module includes a housing 1. A plurality of ignition coil terminals 2 projecting from the housing 1. A cavity 3 enables electrical circuitry 4 to be positioned within the housing. A female plug assembly 5 is positioned on the housing 1. The female plug 5 enables electrical elements 6 to communicate with the module cavity 3 and the ignition system through male plugs (not shown) plugging into the female plug 5.

The module illustrated in FIGS. 7 and 8 is from a General Motors vehicle. The module is shown in General Motors Repair Manual 6D4-4 Ignition System in FIGS. 101 and 901-907.

Accordingly, it is an object of the present invention to provide such a module. The module of the present invention provides the art with a module that is positioned a predetermined distance away from the circuit board so that the module will not interfere with the circuitry already present on the circuit board. The present invention enables interchanging of different circuitries in the same module. Also, the present invention dissipates heat from the circuitry in the modules. Further, the present invention enables the module to be electrically coupled with the circuit board and also with other systems.

The present invention provides the art with a new power module. The power module of the present invention includes a housing. The housing includes an element for supporting the housing in a spaced relationship away from the circuit board. A cavity is defined within the housing. The cavity enables positioning of circuitry or the like in the housing. Also, the cavity includes a mechanism to electrically couple the cavity circuitry with another system and/or a circuit board.

From the following detailed description taken in conjunction with the appended claims, other objects and advantages of the present invention will become apparent to those skilled in the art.

DETAILED DESCRIPTION OF A PREFERRED EMBODIMENT

Figure 1:
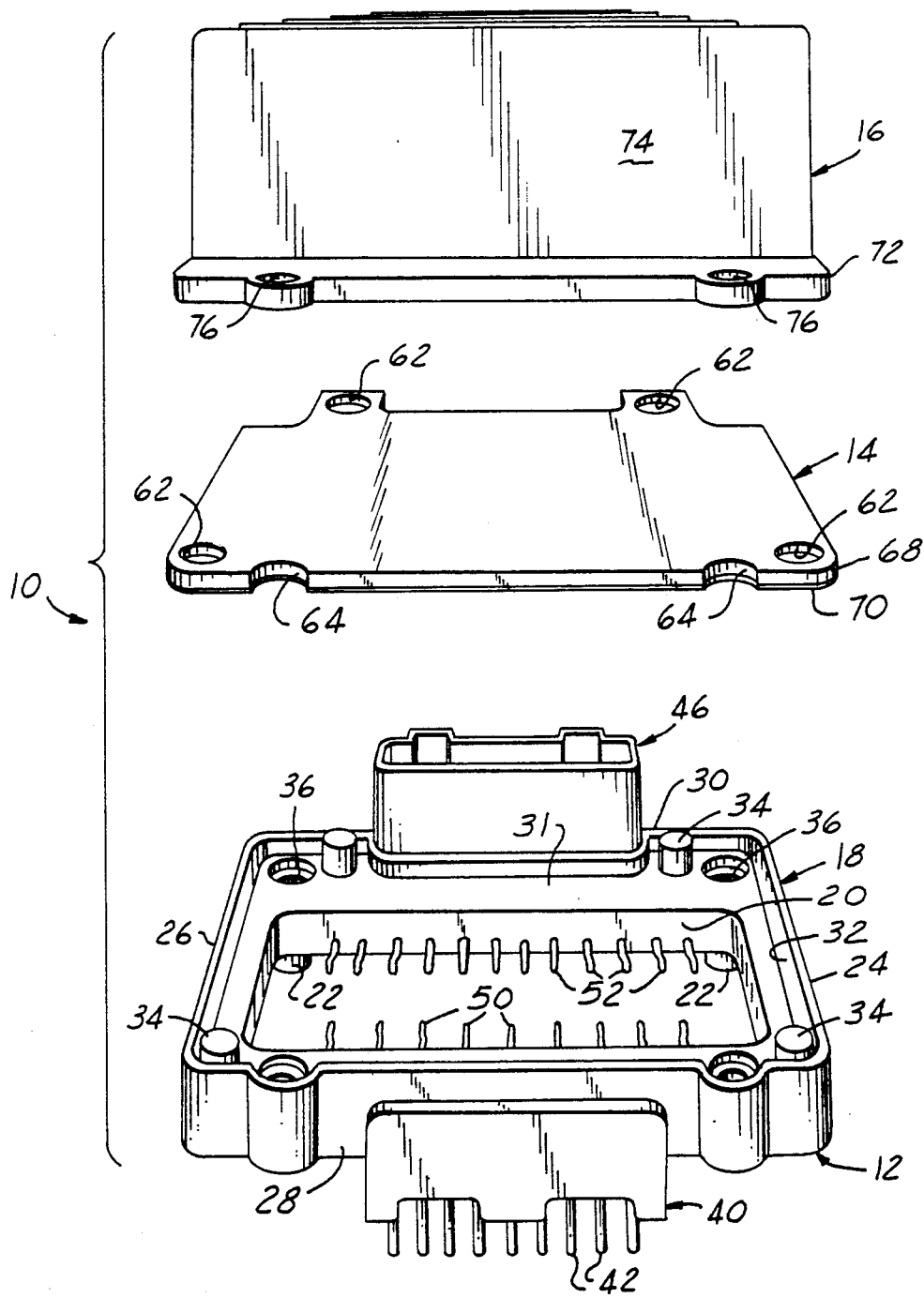
FIG. 1 is an exploded view of a power module in accordance with the present invention.

Referring to the figures, a power module is illustrated and designated with the reference numeral 10. The power module 10 includes a housing 12, a circuitry mounting plate 14 and a heat sink 16.

Figure 2:
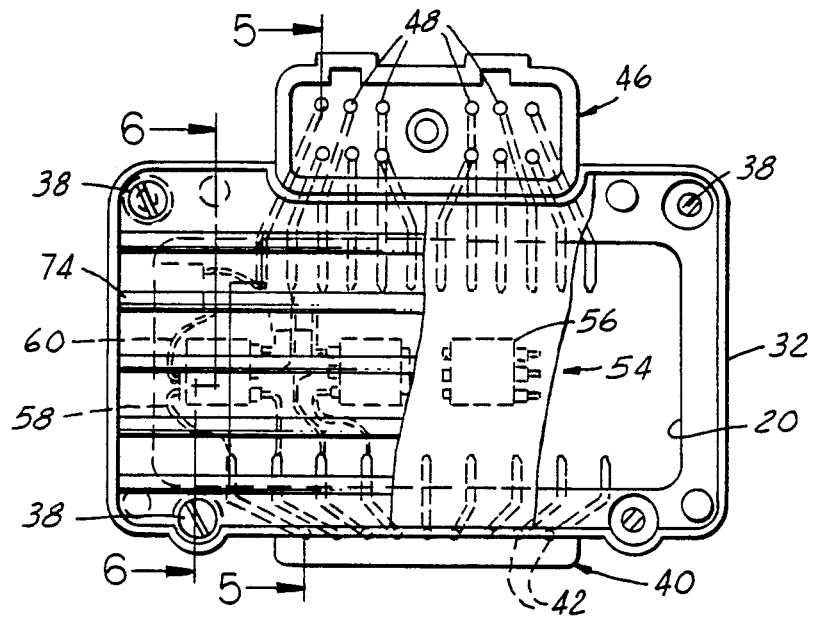
FIG. 2 is a top plan view partially in cross-section of FIG. 1.
Figure 3:
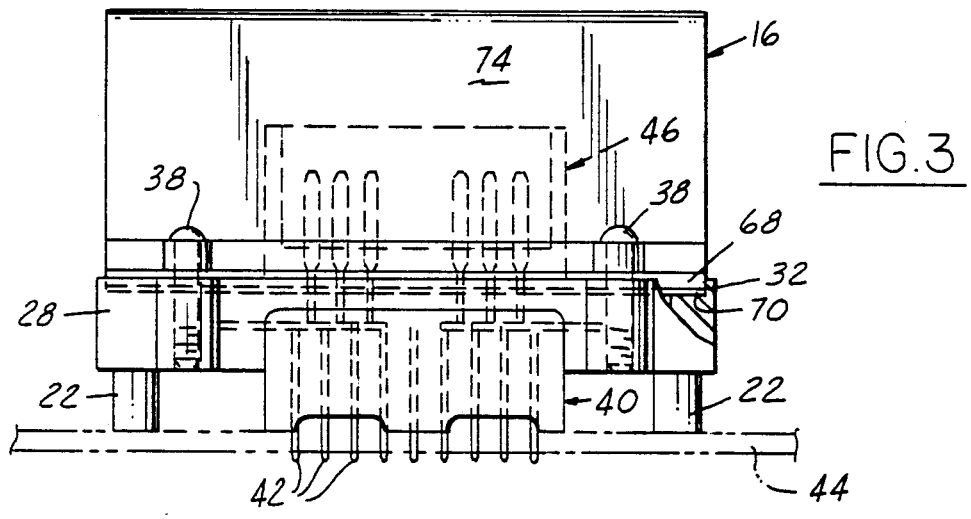
FIG. 3 is a longitudinal side elevation view partially in cross-section of FIG. 1.

The housing 12 includes a rectangular frame 18, a cavity 20 and one or more legs 22. The frame 18 includes lateral sides 24 and 26, and longitudinal sides 28 and 30. The lateral and longitudinal sides form a planar rectangular seating surface 31. A flange 32 projects around the periphery of the planar rectangular seating surface 31 to enable seating of the mounting plate 14, as seen in FIGS. 1 through 3. Also, posts 34 project from seating surface 31 to enable positioning of the mounting plate 14 on the housing frame 18. A plurality of bores 36 are drilled into the frame seating surface 31 to enable fasteners 38 to secure the heat sink 16 to the frame 18.

The legs 22 project from the underside of the frame 18, preferably at the corners of the longitudinal side 30. The legs 22 are preferably at least ⅛" long to position the housing 12 above the circuit board 44. The desired height of the legs 22 can be made proportional to the circuit board. Also, the legs 22 have a length such that the housing 12 is positioned a desired distance away from the circuit board 44 so that the housing 12 does not interfere with the circuitry on the circuit board 44.

A circuit board connector 40 is coupled with the longitudinal side 28 of the frame 18. The circuit board connector 40 includes a plurality of connector pins 42 for injecting into the circuit board 44 to electrically couple the connector pins 42 with the circuit board 44. The circuit board connector 40 also acts as a leg to support the housing frame 18 at the desired distance above the circuit board 44, as seen in FIGS. 3-6.

A harness connector 46 ordinarily extends from the other longitudinal side 30 of the frame 18. The harness connector 46 includes connector pins 48 to electrically couple the connector pins 48 to a system.

The connector pins 42, ordinarily L-shaped, project through the circuit board connector 40, through the longitudinal side 28, and exit into the cavity 20 as mating fingers 50. The connector pins 42 are conductively sealed in the polymeric connector 40 and frame 18. The metallic connector pins 42 with mating fingers 50 enable coupling of the circuitry on the mounting plate 14 with the circuit board 44.

The connector pins 48, ordinarily L-shaped, of the harness connector 46 pass through longitudinal side 30 of the frame 18 and exit into the cavity 20 as mating fingers 52. The connector pins 48 with mating fingers 52 enable the circuitry on the mounting plate 14 to be coupled with a system.

Figure 4:
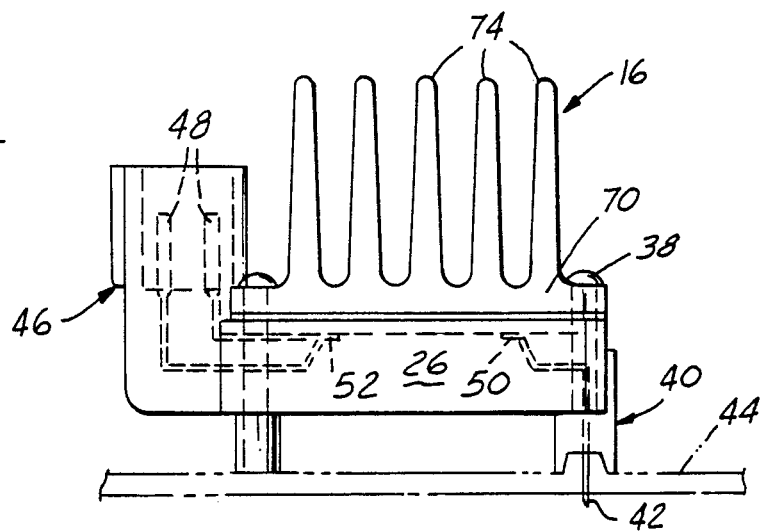
FIG. 4 is a lateral side elevation view of the power module of FIG. 1.
Figure 5:
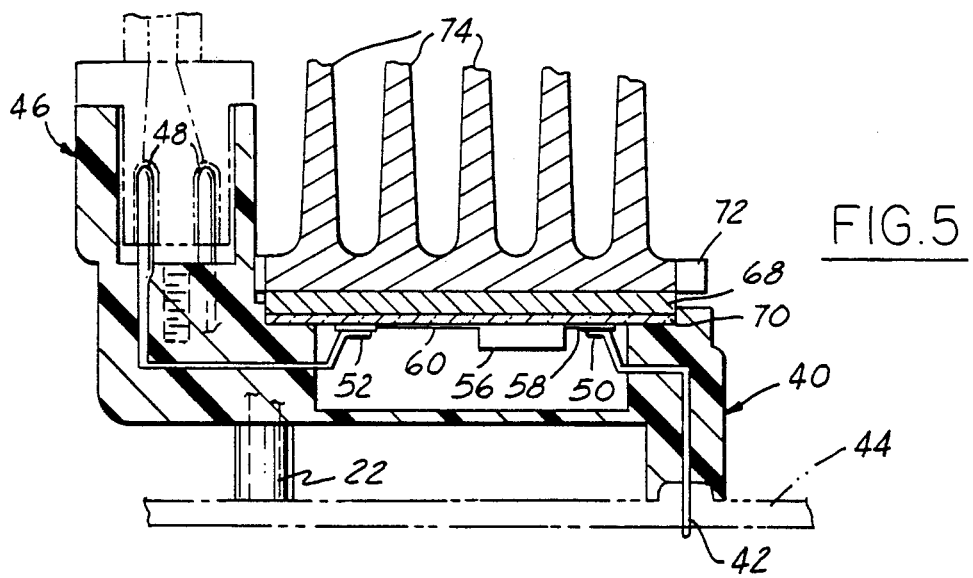
FIG. 5 a cross-section view of FIG. 2 along line 5—5 thereof.

The mating fingers 50 and 52 may have any desired shape, L-shaped as in FIGS. 4 and 5, to couple the connector pins 42 and 44 with the circuitry on the mounting plate 14. The circuitry 54 on the mounting plate 14 may be comprised of a circuit, semiconductor chips or the like. For illustration purposes, semiconductor chips are coupled with leads 58 and 60 which, in turn, are coupled with mating fingers 50 and 52.

The mounting plate 14 generally includes a plurality of apertures 62 to enable positioning of the plate 14 onto the post 34 of the frame 18. The apertures 62 enable the post 34 to pass through the plate 14 so that the plate 14 seats on surface 31 and is positioned within the flange 32. Also, the plate 14 includes recesses 64 to enable passage of fasteners 38 into the frame 18.

Figure 6:
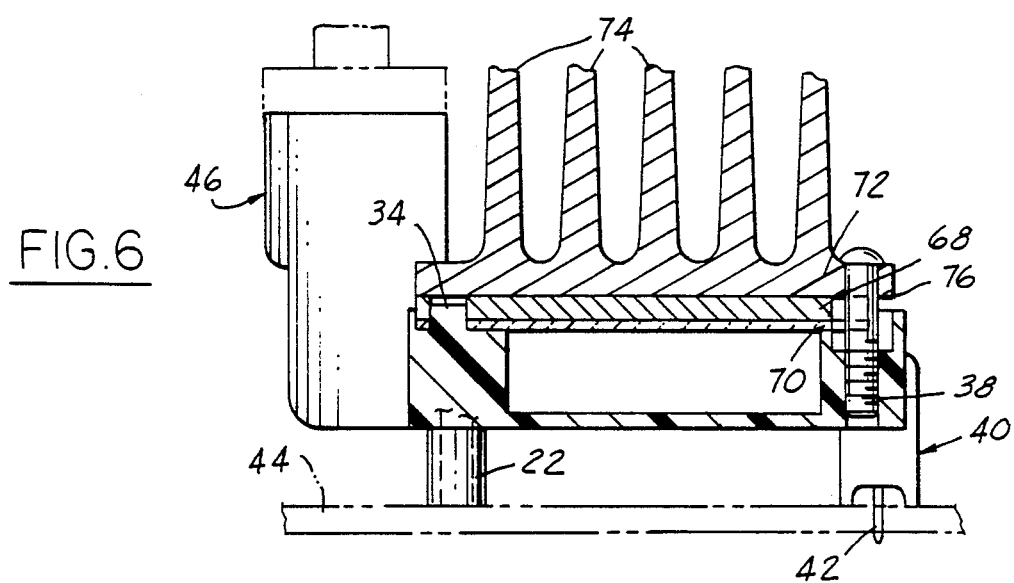
FIG. 6 is a cross-section view of FIG. 2 along line 6—6 thereof.
Figure 7:
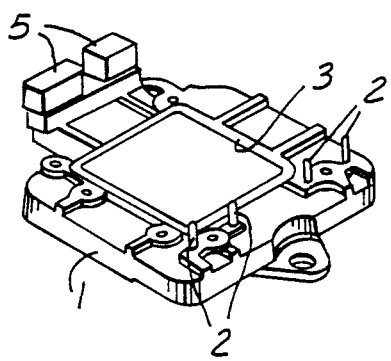
FIG. 7 is a perspective view of a relevant art module.
Figure 8:
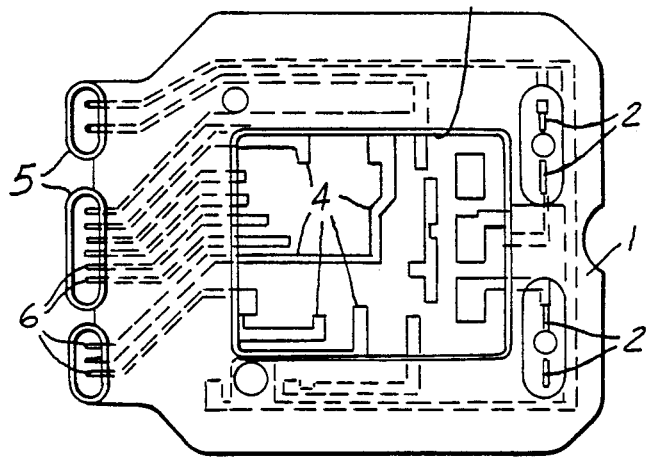
FIG. 8 is a top plan view of the module of FIG. 7.

Ordinarily, the plate 14 includes a metallic heat spreader layer 68 and an insulated layer 70, as seen in FIGS. 1, 5 and 6. The insulated layer 70 abuts the circuitry 54. The metal layer 68 abuts the heat sink 16. (The semiconductors 56 are soldered to the circuitry 54 to adhere the semiconductors 56 to the plate 14.) The insulated layer 70 electrically insulates the circuitry 54 from the metallic heat spreader plate 68. However, the insulated layer 70 enables heat to pass therethrough for heat sinking of the circuitry 54 located on the insulated layer 70.

The heat sink 16 generally includes a plate 72 having projecting fins 74. The plate 72 has apertures 76 to enable passage of fasteners 38 to secure the heat sink 16 to the housing 12. The plate 72 abuts the metallic heat spreader layer 68 of the mounting plate 14. Heat conductively passes from the circuitry 54 through the insulated layer 70, to the metallic heat spreader layer 68, to the heat sink 16. The heat is then dissipated from the heat sink 16 through the fins 74. The fins 74 are metallic and spaced a desired distance apart to enable maximum dissipation of heat.

While the above discloses the preferred embodiment of the present invention, it will become apparent to those skilled in the art that modifications, variations and alterations may be made to the present invention without deviating from the scope and fair meaning of the subjoined claims.

I claim:

1. A power module comprising:
a housing defining a cavity and including a rim peripherally about said cavity, said rim including a surface and a flange extending from said surface, said surface and flange adapted for receiving and positioning a first conduit board including circuitry onto said housing such that said circuitry is positioned within said cavity;
means for supporting said housing in a spaced relationship with respect to a second circuit board, said means or supporting unitarily formed with said housing;
means for electrically coupling the circuitry of the first circuit board in said cavity with the second circuit board or an electrical system, said electrical means having a contact portion extending into said cavity adapted to couple with the circuitry on the first circuit board, a contact portion extending from said housing adapted to be coupled with the second circuit board or the electrical system, and the remainder of the electrical means is concealed within said housing such that a portion of the remainder of the electrical means electrically coupling the first and second circuit board is passed through at least one of said supporting means.

2. The power module according to claim 1 further comprising means for dissipating heat from the circuitry positioned within said housing cavity, said means for dissipating heat mounted on said housing and adapted to be associated with the circuitry.

3. The power module according to claim 1 wherein said means for supporting said housing in a spaced relationship includes a plurality of leg members projecting from said housing, said leg members positioning said housing above the second circuit board such that said housing does not interfere with circuitry on the second circuit board.

4. The power module according to claim 1 wherein said means for electrically coupling circuitry enables coupling of one or more circuits selected from a plurality of different circuits to be positioned in the cavity and electrically coupled with the second circuit board or the system.

5. A power module comprising:
a housing defining a cavity and including a rim peripherally about said cavity having an overall rectangular shape, said rim including a surface and a flange extending from said surface, said surface and flange adapted for receiving and positioning a first circuit board including circuitry onto said housing such that said circuitry is positioned within said cavity;
leg means projecting from said housing for positioning said housing a desired distance away from a second circuit board such that said housing does not interfere with circuitry on the second circuit board;
means for electrically coupling the circuitry of the first circuitry board in said cavity with the second circuit board or an electrical system, said electrical means having a contact portion extending into said cavity adapted to couple with the circuitry on the first circuit board, a contact portion extending from said housing adapted to be coupled with the second circuit board or the electrical system, and the remainder of the electrical means is concealed within said housing such that a portion of the remainder of the electrical means electrically coupling the first and second circuit board is passed through at least one of said leg means.

6. The power module according to claim 5 wherein said desired distance away from the second circuit board is at least ⅛ inch.

7. The power module according to claim 5 further comprising means for dissipating heat from the circuitry positioned within said housing, said means for dissipating heat mounted on said housing and adapted to be associated with the circuitry.

8. The power module according to claim 5 wherein said means for electrically coupling circuitry enables coupling of one or more circuits selected from a plurality of different circuits to be positioned in the cavity and electrically coupled with the second circuit board or system.

9. A power module comprising:

a housing defining a cavity and including a rim peripherally surrounding said cavity and having an overall rectangular shape, said rim including a surface, a flange extending from said surface and one or more posts extending from said surface, said surface and flange adapted for receiving a first circuit board including circuitry onto said housing such that said circuitry is positioned within said cavity, said one or more posts adapted to mate with one or more apertures in said first circuit board to position said first circuit board on said housing;

leg means projecting from said housing for positioning said housing a desired distance away from a second circuit board such that said housing does not interfere with circuitry on the second circuit board;

means for electrically coupling the circuitry of the first circuitry board in said cavity with the second circuit board or an electrical system, said electrical means having a contact portion extending into said cavity adapted to couple with the circuitry on the first circuit board, a contact portion extending from said housing adapted to be coupled with the second circuit board or the electrical system, and the remainder of the electrical means is concealed within said housing such that a portion of the remainder of the electrical means electrically coupling the first and second circuit board is passed through at least one of said leg means.

* * * * *